United States Patent
Dai

[11] Patent Number: 5,882,996
[45] Date of Patent: Mar. 16, 1999

[54] METHOD OF SELF-ALIGNED DUAL DAMASCENE PATTERNING USING DEVELOPER SOLUBLE ARC INTERSTITIAL LAYER

[75] Inventor: Chang-Ming Dai, Hsinchu, Taiwan

[73] Assignee: Industrial Technology Research Institute, Hsin-Chu, Taiwan

[21] Appl. No.: 949,354

[22] Filed: Oct. 14, 1997

[51] Int. Cl.[6] .................................................. H01L 21/44
[52] U.S. Cl. ...................... 438/597; 438/624; 438/636; 438/638; 438/700
[58] Field of Search ..................... 438/597, 622, 438/624, 634, 636, 637, 638, 675, 700, 738, 740

[56] References Cited

U.S. PATENT DOCUMENTS

| | | | |
|---|---|---|---|
| 5,219,788 | 6/1993 | Abernathey et al. | 437/187 |
| 5,378,649 | 1/1995 | Huang | 437/52 |
| 5,482,817 | 1/1996 | Dichiara et al. | 430/271.1 |
| 5,529,953 | 6/1996 | Shoda | 437/189 |
| 5,578,523 | 11/1996 | Fiordalice et al. | 438/638 |
| 5,614,765 | 3/1997 | Avanzho et al. | 257/774 |
| 5,663,101 | 9/1997 | Cronin | 438/637 |
| 5,691,238 | 11/1997 | Avanzino et al. | 438/637 |
| 5,736,557 | 4/1998 | Zhao | 438/638 |
| 5,741,741 | 4/1998 | Tseng | 438/637 |
| 5,801,094 | 9/1998 | Yew et al. | 438/640 |
| 7,541,626 | 4/1998 | Jain et al. | 438/636 |

OTHER PUBLICATIONS

S. Wolf et, "Silicon Processing for the VLSI Era" vol. 1, Lattice Press, Sunset Beach. CA 1986, p. 443 (No Month).

Primary Examiner—Tuan H. Nguyen
Attorney, Agent, or Firm—George O. Saile; Stephen B. Ackerman

[57] ABSTRACT

A method is disclosed for patterning dual damascene interconnections in semiconductor chips through the use of a developer soluble ARC interstitial layer. This is accomplished by providing a silicon substrate having a composite layer of insulation deposited thereon whereby said composite layer comprises a first layer of dielectric separated from a second layer of dielectric by an intervening intermediate layer of silicon nitride. Then, two layers of photoresist are deposited with an intervening interstitial layer of water soluble anti-reflective coating (ARC). The ARC, having a relatively high refractive index, serves as a barrier to light so that the top layer of photoresist is first line patterned without affecting the second layer. The second layer of photoresist is next hole patterned. The hole pattern is transferred into the top dielectric layer and the intervening silicon nitride layer by etching. The line pattern in the first photoresist layer is etched into the top dielectric layer at the same time the hole pattern is transferred from the top dielectric layer into the bottom dielectric layer by the same etching process. The photoresist layers are then removed and the dual damascene structure thusly formed is filled with metal forming the metal line and hole interconnection on the semiconductor substrate.

31 Claims, 6 Drawing Sheets

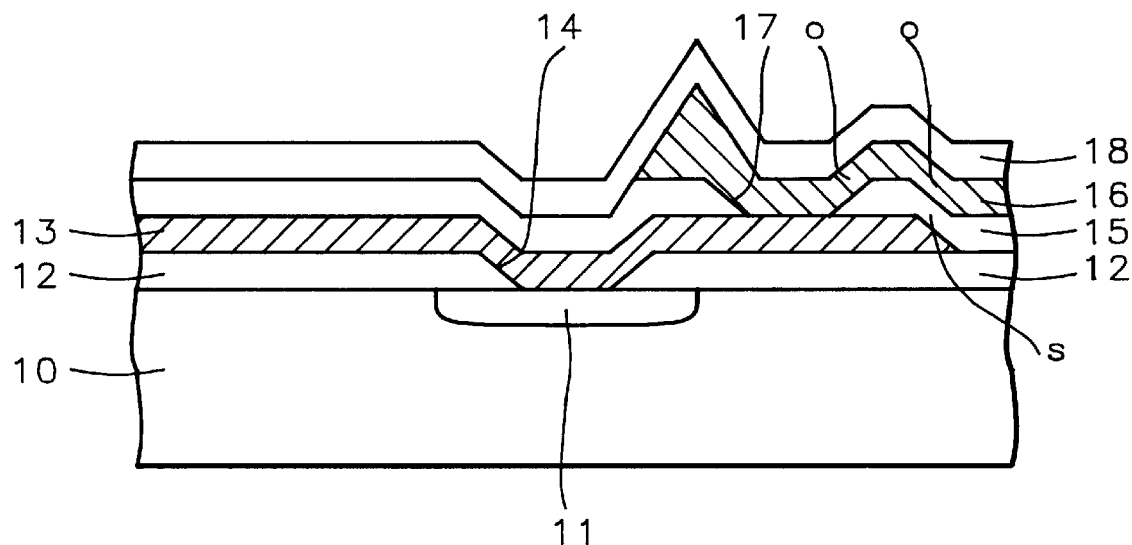
FIG. 1 — Prior Art
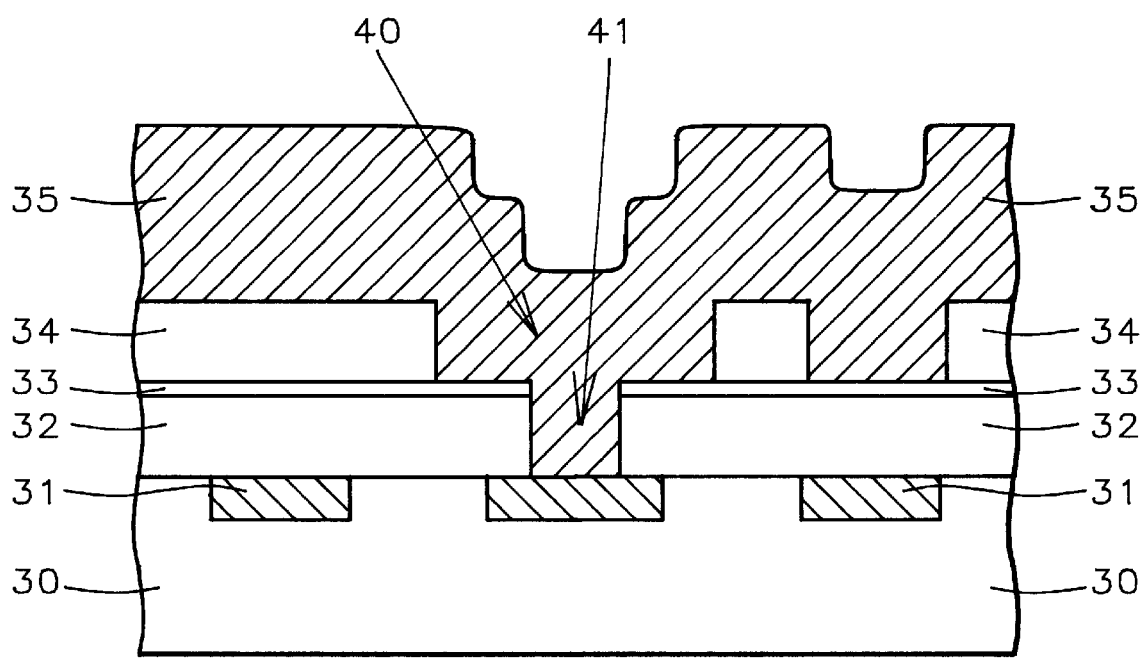
FIG. 2a — Prior Art

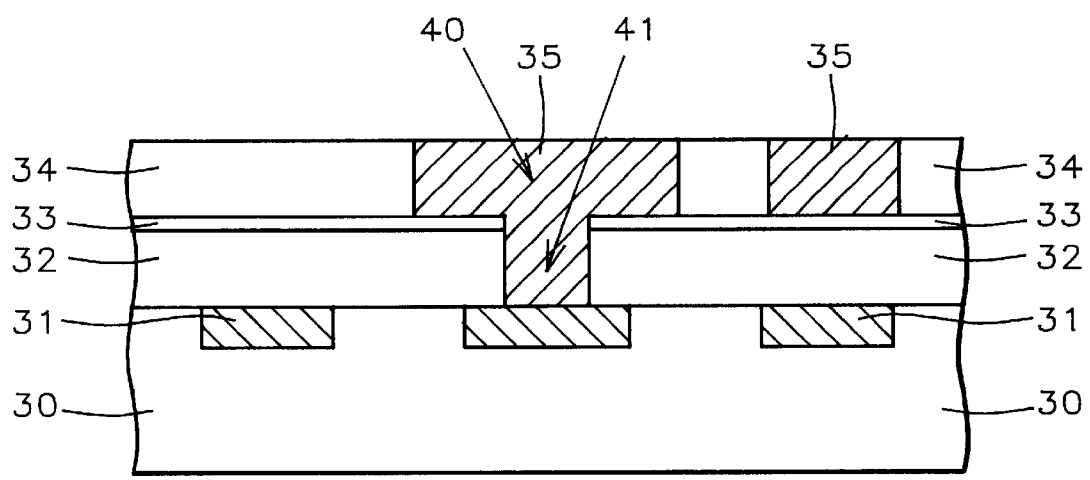
FIG. 2b – Prior Art
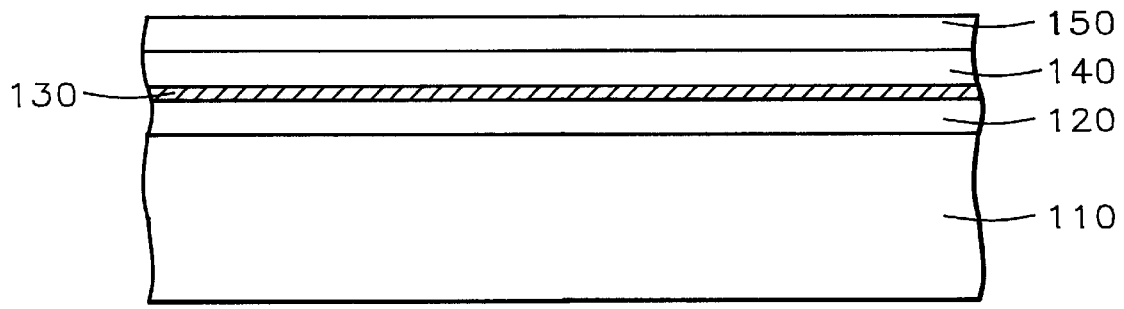
FIG. 3a
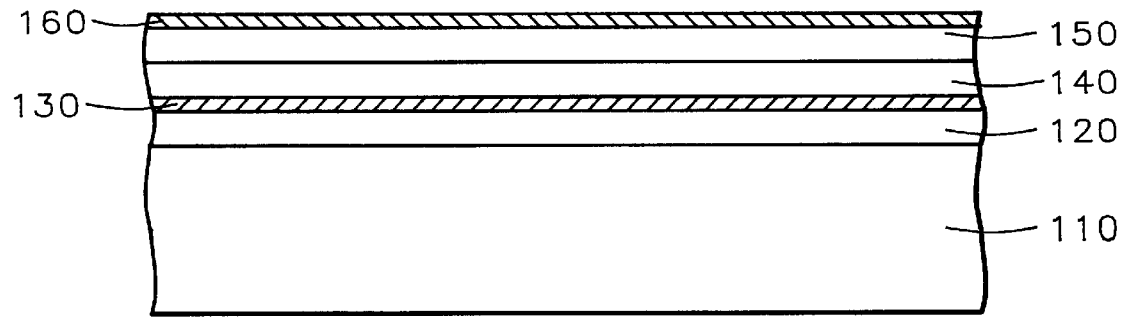
FIG. 3b

METHOD OF SELF-ALIGNED DUAL DAMASCENE PATTERNING USING DEVELOPER SOLUBLE ARC INTERSTITIAL LAYER

RELATED PATENT

U.S. Patent Application by the same inventor C. M. Dai filed Oct. 14, 1997, Ser. No. 08/949,358 entitled "Two-layered TSI Processes for Dual Damascene Patterning"; filed Oct. 14, 1997, Ser. No. 08/949,350 entitled "Dual Damascene Process Using Single Photoresist Process"; filed Oct. 14, 1997, Ser. No. 08/949,353 entitled "Single-mask Dual Damascene Processes by Using Phase-shifting Mask"; and filed Oct. 14, 1997, Ser. No. 08/949,352 entitled "Opposed Two-Layered Photoresist Process for Dual Damascene Patterning", assigned to common assignee.

BACKGROUND OF THE INVENTION

(1) Field of the Invention

The present invention relates to the manufacture of ultra large scale integrated (ULSI) circuit chips in general, and in particular, to the patterning of dual damascene interconnections in semiconductor chips through the use of a developer soluble ARC interstitial layer.

(2) Description of the Related Art

Damascene process, or inlaid metal patterning in preformed grooves, is usually a preferred method of fabricating interconnections for integrated circuits. Unlike with damascene interconnections which will be described more in detail later, the more conventional interconnections are formed by blanket depositing a conductive material on an insulation layer such as silicon oxide, and then etching the desired wiring pattern on the layer. The vertical connections between the wiring layers are made separately by forming holes in the insulation layers separating the metallized layers and then filling them with the same or a different conductive material. It will be appreciated that as the number of wiring layers increase, the number of photolithographic processes required to form the interconnection and hole patterns will also increase proportionately. It is disclosed in this invention a method for reducing the number of photolithographic steps in especially the more recent dual damascene structures. This is accomplished through a novel use of a developer soluble ARC interstitial layer as disclosed later in the embodiments of this invention.

Normally, a semiconductor chip contains one or more metal wiring layers that are separated from each other by an insulating layer and are further separated by still another insulating layer from the devices that are formed near the surface of the semiconductor that forms the base of the chip. The wiring stripes are connected to each other and to the devices at the appropriate places by means of holes that are filled with metal through the insulating layers. The holes that connect the metal lines to each other through the insulating layer are called via holes, while the holes that reach the underlying devices through its insulating layer are called contact holes. Typically, the holes are etched into an insulating layer after the latter has been deposited on the semiconductor substrate on which the chips are fabricated. It is common practice to next blanket deposit metal on the insulating layer thereby filling the holes and then forming the metal lines by etching through a patterned photo resist formed on the metal layer. For the first metal layer, electrical contact is made with the underlying devices through contact holes, or windows, that allow the metal to descend through the dielectric insulator to the devices. For the second and subsequent wiring layers, the process is repeated and the contact between the metal layers is made through via holes that allow the metal to descend to the lower metal layer(s). It is also common practice to fill the holes separately with metal to form metal plugs first, planarize or smoothen them next with respect to the surface of the insulating layer and then deposit metal layer to make contact with the via plugs and then subtractively etch as before to form the required "personalized" wiring layer.

To provide robust contact area at the junction where the metal lines contact the devices or the via plugs in the case of multilayer wiring, it is usually necessary to increase the dimensions of the various features in he metal line and the holes to compensate for overlay errors and process bias inherent in lithographic process. This increase in the size of the design ground rules results in a significant loss in circuit layout density. Furthermore, there is considerable development effort expended on photolithographic equipment and processes to make improvement in overlay error and process tolerances. To minimize the chip area devoted to overlay tolerance and lithography costs, several "self-aligned" processes have been developed by workers in the field.

There are also other problems associated with forming contacts between metal layers in a substrate. Where contact windows are etched into a dielectric layer, the sides of the contact windows must be sloped to guarantee good continuity of the metal layer as it descends into the contact window. The steeper the slope, the more likely it is the metallurgy will have breaks at the edges of the contact windows. However, the use of a gradually sloped sidewall to guarantee metal line continuity takes up valuable chip area and prevents contact windows from being packed as closely as desired. In addition, the use of contact windows creates an irregular and nonplanar surface which makes it difficult to fabricate the subsequent interconnecting layers as shown in FIG. 1.

The structure shown in FIG. 1 is a typical example of a semiconductor substrate fabricated using prior art techniques. After having defined device regions represented by reference (11) on substrate (10), a first insulating layer (12) is formed and patterned thereon. First level metal layer (13) is next deposited to make contact with region (11) through contact window (14). Similarly, the second level metal layer (16) makes contact with metal layer (13) through via hole (17) patterned in second insulating layer (15). The structure is passivated with a third insulating layer (18). Although the structure depicted in FIG. 1 is not to scale, it exemplifies a very irregular surface which creates reliability problems. One such problem is the potential short at location (S) between the first and second levels of metal layers, due to the thinning of the insulating layer therebetween, and still another one is the risk of a potential open circuit at locations (O), due to the thinning of the metal layer at that location.

One solution that is found in prior art in addressing the problems cited above is the dual damascene process. In its simplest form, this process starts with an insulating layer which is first formed on a substrate and then planarized. Then horizontal trenches and vertical holes are etched into the insulating layer corresponding to the required metal line pattern and hole locations, respectively, that will descend down through the insulating layer to the underlying features, that is, to device regions if through the first insulating layer, or to the next metal layer down if through an upper insulating layer in the substrate structure. Metal is next deposited over the substrate thereby filling the trenches and the holes, and hence forming metal lines and the interconnect holes simultaneously. As a final step, the resulting surface is planarized using the well-known chemical-mechanical polish (CMP), and readied to accept another dual damascene structure, that is, integrally inlaid wiring both in the horizontal trenches and vertical holes, hence the duality of the process.

A dual damascene structure before and after CMP is shown in FIGS. 2a and FIG. 2b. Two photolithographic processes and two insulator layers separated by an etch stop layer are employed to achieve the shown structure as follows: a starting planarized surface (30) is provided with patterned first level metal (31). A first layer of insulator (32) is deposited over a fist level of patterned metal to which contacts are to be selectively established. The first layer is planarized and then covered by an etch stop material (33). Contact holes are defined in the etch stop material by a first photolithography at locations where vertical plug interconnects are required. The thickness of the first insulator layer (32) is made equal to the desired plug height. The first insulator layer is not etched at this time. Next, a second insulator layer (34), having a thickness equal to the thickness of the second level of patterned metal of the mullet-level structure, is deposited over the etch stop material (33). The second insulator layer (34), in turn, is etched by second photolithography down to the etch stop material (33) to define desired wiring channels (40), some of which will be in alignment with the previously formed contact hole (41) in the etch stop material. in those locations where the contact holes are exposed, the etching is continued into the first insulator layer to uncover the underlying first level of patterned metal. The horizontal channels and vertical holes etched into the second and first insulator layers are next overfilled with metal (35). As a final step, excess metal (35) on top of the second insulator layer (34) but not in the channels (40) or holes (41) is removed by etching or chemical-mechanical polishing, as shown in FIG. 2b.

It will be appreciated by those skilled in the art that the dual damascene process alleviates the problem of registration of holes with metal lines, and the concomitant contact problems along with the issue of excessive overlay tolerances. At the same time, wiring can be kept to the minimum ground rules tolerances and also problems associated with the thinning of insulator and/or metal around sloped holes can be circumvented. However, it is also evident that the process is complicated, especially in the area where two photolithographic steps must be performed to form the vertical holes. Here, the hole pattern must first be defined lithographically after the etch stop has been formed, and also later when the hole is etched lithographically. Furthermore, two photoresist processes must be used to form the hole and line patterns. The multiplicity of the processes results in lower productivity, and increased cost.

Nevertheless, in prior art, some of the dual damascene steps have been used to advantage. For example, Huang in U.S. Pat. No. 5,378,649 teaches to form two sets of resist patterns through a double photoloithograhpic process in order to form metal lines over buried bit lines so as to better protect the bit lines from code implants. Shoda, on the other hand, discloses in U.S. Pat. No. 5,529,953 a method of manufacturing a stud (vertical metal plug) and (horizontal) interconnect in a dual damascene structure using selective deposition where the selective deposition is accomplished through repeated application of masks and photolithographic processes. In still another approach, recognizing the multiplicity of mask patterning steps in dual damascene process, Avanzino in U.S. Pat. No. 5,614,765 teaches the use of one mask pattern for the formation of both the conductive lines and the vias simultaneously. Though only one mask, the process of forming the conductive lines and the vertical vias on the substrate itself becomes complicated due to the nature of the design of the mask.

Application of anti-reflective coating (ARC) in the forming of damascene structures seems to be lacking in prior art. In U.S. Pat. No. 5,219,788, Abernathey, et al., disclose the use of a particular ARC to prevent an interaction between it and the underlying photoresist. The anti-reflective coating composition taught by Dichiara, et al., in U.S. Pat. No. 5,482,817, on the other hand, is designed to be insoluble in the developer for the chemically amplified photoresist composition. In the present invention, the ARC that is proposed as an interstitial layer in the forming of damascene structures is soluble and is used differently from what is practiced in prior art.

SUMMARY OF THE INVENTION

It is therefore an object of this invention to provide a method of forming dual damascene patterns using a top surface imaging process with two photoresist layers, but employing single photolithography with the aid of an interstitial anti-reflective coating in the manufacture of semiconductor substrates and chips.

It is another object of this invention to provide a method for improving the alignment of a wiring layer to underlying interconnect hole pattern.

It is yet another object of this invention to provide a method for reducing overlay tolerances and process bias in order to increase the packing density of ultra large scaled integrated chips.

These objects are accomplished by providing a silicon substrate having a composite layer of insulation deposited thereon whereby said composite layer comprises a first layer of dielectric separated from a second layer of dielectric by an intervening intermediate layer of silicon nitride. Then, two layers of photoresist are deposited with an intervening interstitial layer of water soluble anti-reflective coating (ARC). The ARC, having a relatively high refractive index, serves as a barrier to light so that the top layer of photoresist is first line patterned without affecting the second layer. The bottom layer of photoresist is next hole patterned. The hole pattern is transferred into the top dielectric layer and the intervening silicon nitride layer by etching. The line pattern in the top photoresist layer is transferred to the bottom photoresist layer by blanket resist etching process. Next, the line pattern in the first, or bottom, photoresist layer is etched into the top dielectric layer at the same time the hole pattern is transferred from the top dielectric layer into the bottom dielectric layer by the same etching process. The photoresist layers are then removed and the dual damascene structure thusly formed is filled with metal forming the line trench and hole interconnection on the semiconductor substrate.

BRIEF DESCRIPTION OF THE DRAWINGS

In the accompanying drawings, similar numerals refer to similar parts throughout the several views.

FIG. 1 is a partial cross-sectional view of a semiconductor substrate showing a non-planar multilayered metal structure resulting from prior art methods.

FIGS. 2a–2b are partial cross-sectional views of a semiconductor substrate showing the conventional forming of a dual damascene structure before and after planarization.

FIG. 3a is a partial cross-sectional view of a semiconductor substrate having a photoresist layer formed on a composite layer of insulation according to this invention.

FIG. 3b shows the forming of an interstitial layer of a water soluble anti-reflective coating (ARC) on the substrate of FIG. 3a of this invention.

DESCRIPTION OF THE PREFERRED EMBODIMENTS

Figure 3C:
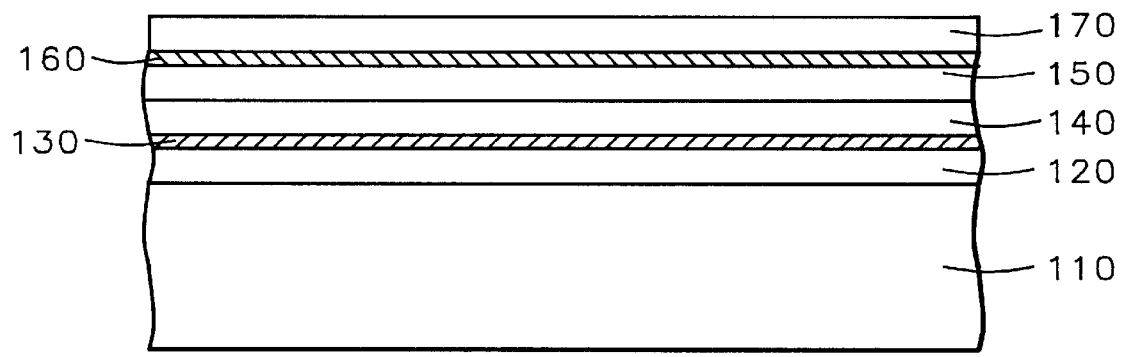
FIG. 3c shows the forming of a second layer of photoresist over the anti-reflective coating of FIG. 3b of this invention.

Referring now to the drawings, in particular to FIGS. 3a–3l, there are shown schematically steps of forming a dual damascene structure employing two layer photoresist process with single photolithography step through the use of an interstitial anti-reflective coating. In the presently disclosed process, patterns formed in top layers of photoresist are precisely transferred to the lower layers of dielectric in a substrate by dry etching the latter layers anisotropically.

In FIG. 3a, substrate (110), preferably silicon, is provided with a composite tri-layer dielectric insulation comprising bottom and top layers (120) and (140), respectively, and a middle layer (130). A layer of photoresist (150) is next formed on the composite layer.

It is preferred that top and bottom layers of insulation, that is, layers (120) and (140), are plasma enhanced chemical vapor deposited (PECVD) phosphosilicate glass (PSG) in a low pressure environment at a chamber pressure between about 0.5 to 10 torr, temperature between about 300° C. to 600° C. with reactant gas $SiH_4$ at a flow rate between about 100 to 500 standard cubic centimeters per minute (sccm) in a diluent carrier gas $PH_3$ at a flow rate between about 20 to 300 sccm. The thickness of bottom (120) and top (140) layers of dielectric are between about 0.3 to 0.7 micrometers ($\mu$m).

Middle layer (130) is an etch barrier film such as silicon nitride (SiN) to prevent the upper trench (line) patterns of dual damascene from being etched through if the layer underlying the composite insulation layer is for via hole or contact hole (not shown). (It will briefly be noted here that substrate (110) in FIG. 3a is provided with a substructure of devices formed in the substrate and/or metal layers thereof, and as they are not significant to the invention, they are not described in detail in order not to unnecessarily obscure the present invention.) Other barrier films may be used, however silicon nitride is preferred because it becomes part of the composite insulation layer and has different etch characteristics than oxide regions. That is, silicon nitride allows a selective etch process with respect to different underlying materials. Spin-on-glass and plasma nitride are also suitable as etch stop materials when polyimide layers are used. It is preferred that silicon nitride be deposited using plasma enhanced PECVD and that it has a thickness between about 500 to 2000 angstroms (Å).

The surface of layer (140) in FIG. 3a is planarized, preferably using chemical-mechanical polishing process. Etching back or using capping method are also suitable for planarizing the surface of layer (140). Then, a first layer of photoresist (150) is formed on PSG layer (140). It is preferred that photoresist (150) is a chemical amplification resist (CAR) and it is of positive (P)-type. The CAR is made using a photo acid generator (PAG) instead of the conventional photosensitive agent, and an example of P-type resist is K2G made by JSR in Japan. The preferred thickness of first layer of photoresist (150) shown in FIG. 3a is between about 0.4 to 0.9 $\mu$m.

In accordance with a key aspect of this invention, a layer of anti-reflective coating (ARC) is next formed over first layer of photoresist (150) with a preferred thickness between about 300 to 700 angstroms (Å). It is critical that the ARC has a refractive index between about 1.4 to 2.0 and that it is water soluble. These properties of the ARC enable the operability of this invention with a simple single photolithographic step as disclosed below. Then, a second layer of chemical amplification resist (170) is formed over the interstitial ARC layer (160) as shown in FIG. 3c. It is preferred that the thickness of second layer of CAR (170) is also between about 0.4 to 0.9 $\mu$m and that it is (n)-type photoresist though positive (n)-type can also be used.

Figure 3D:
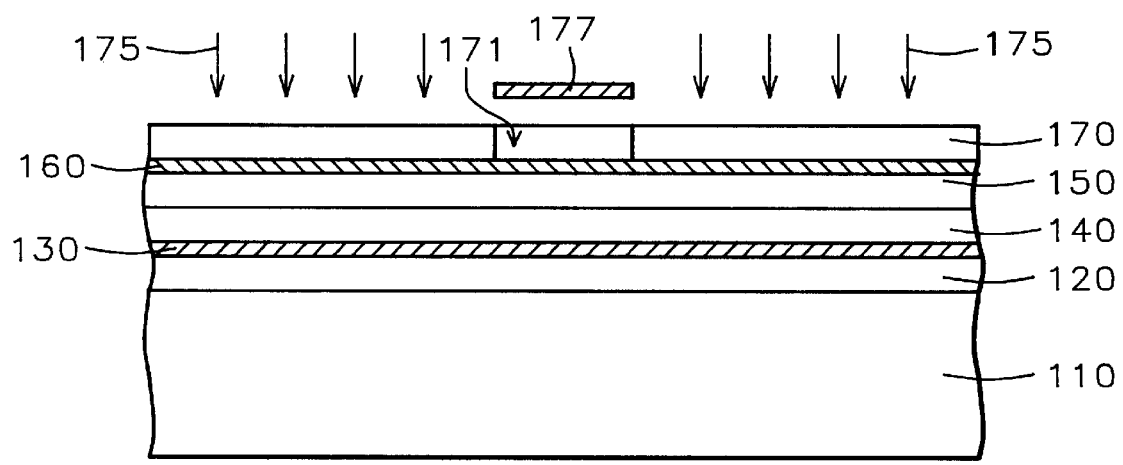
FIG. 3d shows the line-exposure of the top layer of photoresist of FIG. 3c of this invention.
Figure 3E:
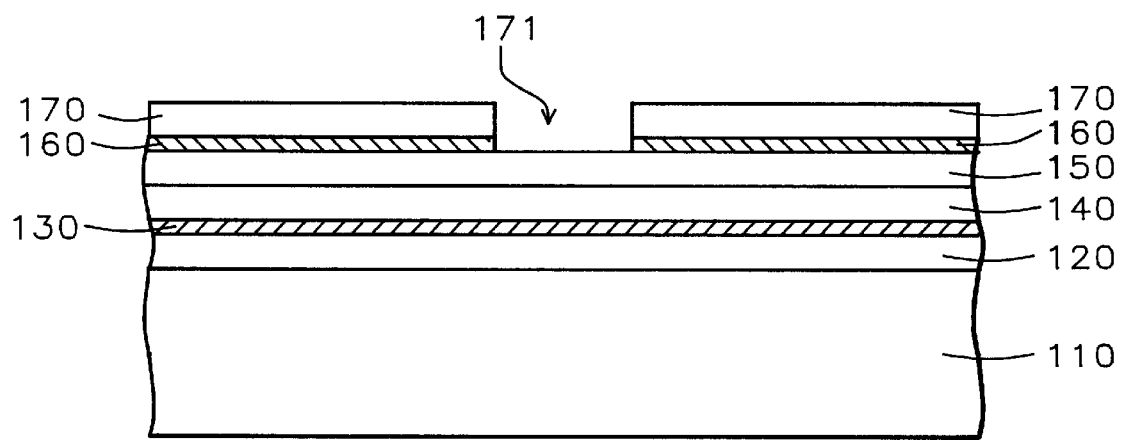
FIG. 3e shows the wet developing and forming of the line pattern in the top photoresist layer and washing of the interstitial layer of FIG. 3d of this invention.

Following the forming of the two-layer photoresist with the intervening ARC layer, the second or top (170) layer of the photoresist is exposed (175) through a clear field mask (177) having a metal line reticle, and line patterned as shown in FIG. 3d. It will now be apparent that because of the presence of the key light reflecting interstitial layer (160), the line pattern is formed only in the second layer of (n)-type phtoresist (170) and first layer of photoresist (150) is blocked from exposure. Subsequently, second photoresist layer (170) is wet developed anisotropically and removed from the unexposed line pattern region (171) as shown in FIG. 3e. It will be noted that the exposed ARC in the line pattern region (171) is also removed because it is soluble in the preferred wet developer comprising 2.38% TMAH solution applied over the region on the substrate. (The puddle technique is a resist development process which is described in S. Wolf and R. N. Tauber, "Silicon Processing for the VLSI Era," vol. 1, Lattice Press, Sunset Beach, Calif. 1986, p.443).

Figure 3F:
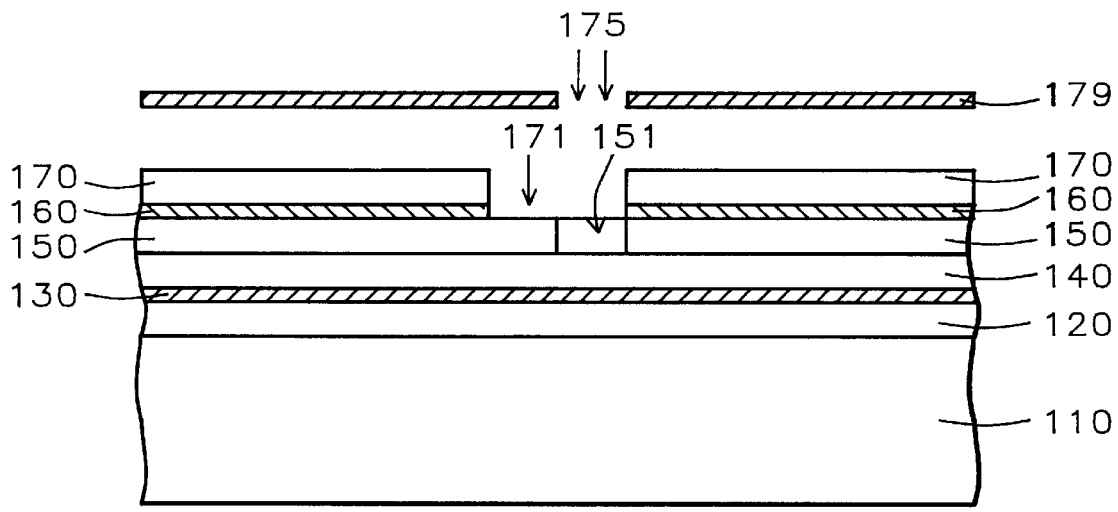
FIG. 3f shows the hole-exposure of the lower photoresist layer of FIG. 3e of this invention.
Figure 3G:
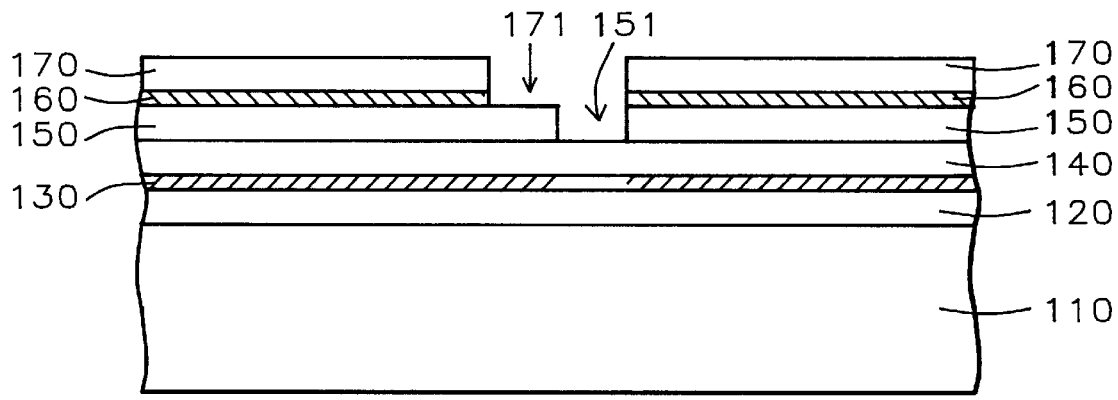
FIG. 3g shows the forming of the hole pattern in the lower layer of photoresist of FIG. 3f of this invention.

Hole pattern is next formed in first layer of photoresist (150) through the line pattern opening in second layer of photoresist (170) by exposing the latter with a dark field reticle mask (179) as shown in FIG. 3f. Photoresist in hole region (151) is then removed (FIG. 3g) anisotropically by using a "stream puddling technique" for about 45 to 70 seconds. (In this technique— as described more in detail in S. Wolf and R. N. Tauber, "Silicon Processing for the VLSI Era," vol. 1, Lattice Press, Sunset Beach, Calif., 1986, p.443— a fixed amount of the developer solution is dispensed on the stationary wafer and after a required develop dwell time, the developing action is stopped by directing a stream of deionized water onto the developed wafer followed by a spin-dry.)

Figure 3H:
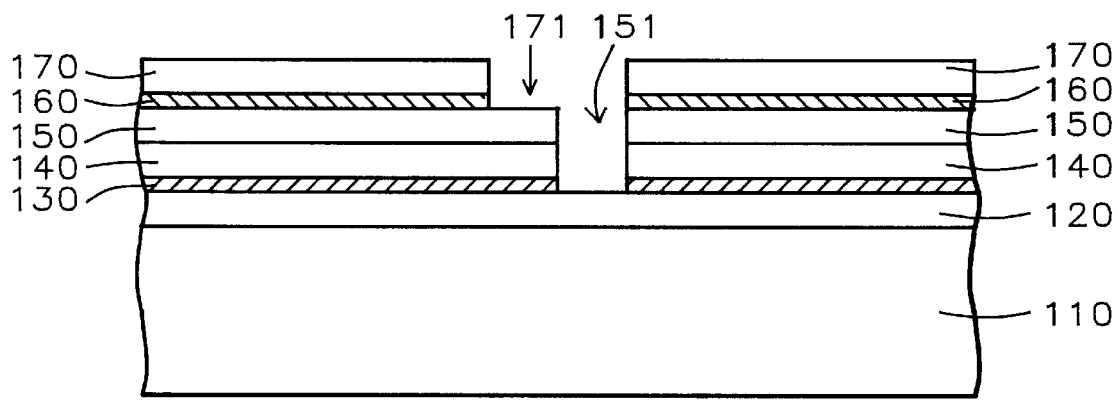
FIGS. 3h shows the transferring of the hole pattern from the lower layer of photoresist into the top and intermediate layers of the composite layer of FIG. 3g of this invention.

Using the hole pattern in first layer of photoresist (150) as a mask, top oxide layer (140) is next etched to transfer the hole pattern as shown in FIG. 3h. It is preferred that the recipe used for dry etching the oxide layer comprises gases Ar, $CHF_3$ and $C_4F_0$ at a flow rate between about 50 to 150 standard cubic centimeter per minute (sccm), 10 to 50 sccm, and 0 to 22 sccm, respectively. The recipe is next changed to gases Ar, $CHF_3$ and $CF_4$ at a flow rate between about 50 to 150, 0 to 100 and 0 to 50 sccm, respectively in order to etch the SiN layer (130) shown in the same FIG. 3h in a high density plasma (HDP) nitride etcher. It is also preferred that the etching selectivity of oxide is higher than ten so that the thickness of the photoresist is maintained while etching the oxide layer.

Figure 3I:
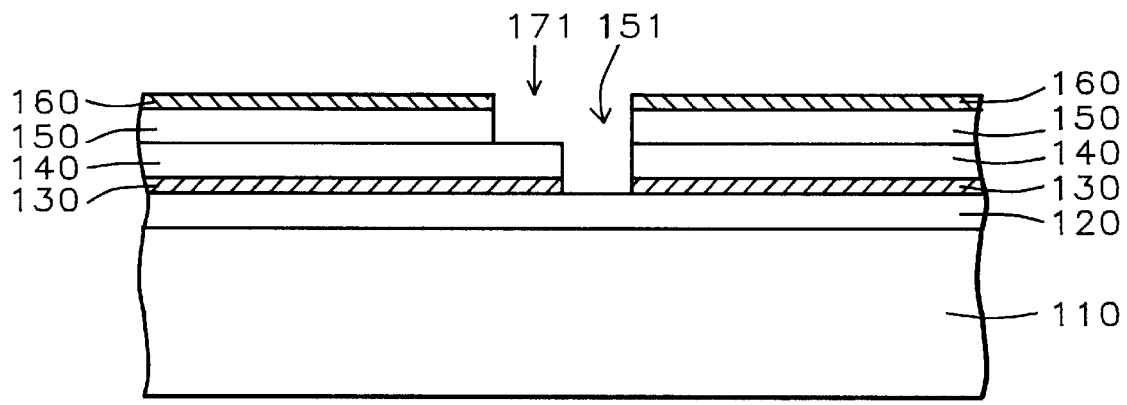
FIG. 3i shows the transferring of the line pattern from the top layer of photoresist into the lower layer of photoresist of FIG. 3h of this invention.
Figure 3J:
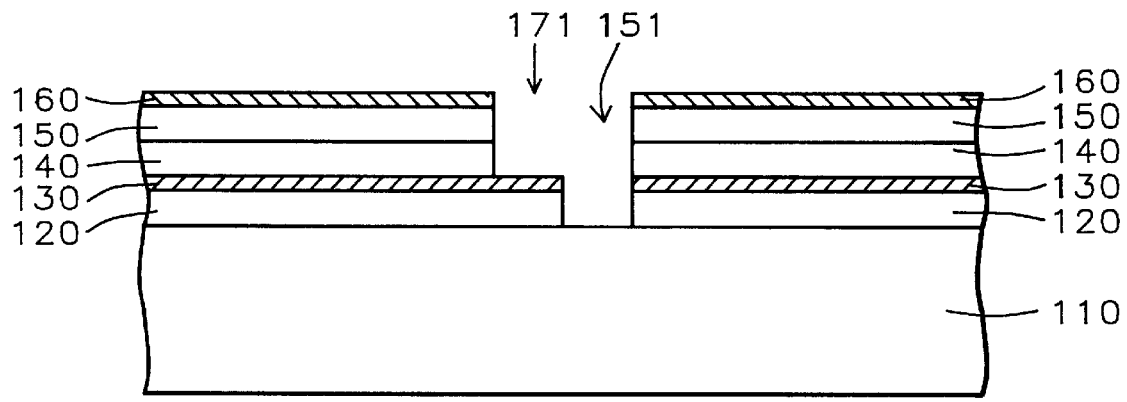
FIG. 3j shows the simultaneous transfer of line pattern into the top dielectric layer and hole pattern into the lower dielectric layer of FIG. 3i of this invention.

Line pattern (171) in photoresist layer (150) is next extended down to the top of oxide layer (140) with a blanket resist dry etch recipe comprising gases $O_2$, He and $CF_4$ at a flow rate between about 10 to 250 standard cubic centimeter per minute (sccm), 40 to 80 sccm, and 0 to 50 scem, respectively. It will be appreciated that in this important step, along with layer (170), any resist residue in either the hole pattern (151) or in the line pattern (171) will be anisotropically removed as shown in FIG. 3i. Subsequently, photoresist layer (140) used to form hole pattern (151) is now used in FIG. 3j to transfer line pattern (171) into the top oxide layer (140). This is accomplished while simultaneously transferring hole pattern (151) into the lower oxide layer (120) by etching in a HDF oxide etcher with a recipe comprising gases Ar, $CHF_3$ and $C_4F_0$ at a flow rate between about 50 to 150 sccm, 10 to 50 sccm, and 0 to 22 sccm, respectively.

Figure 3K:
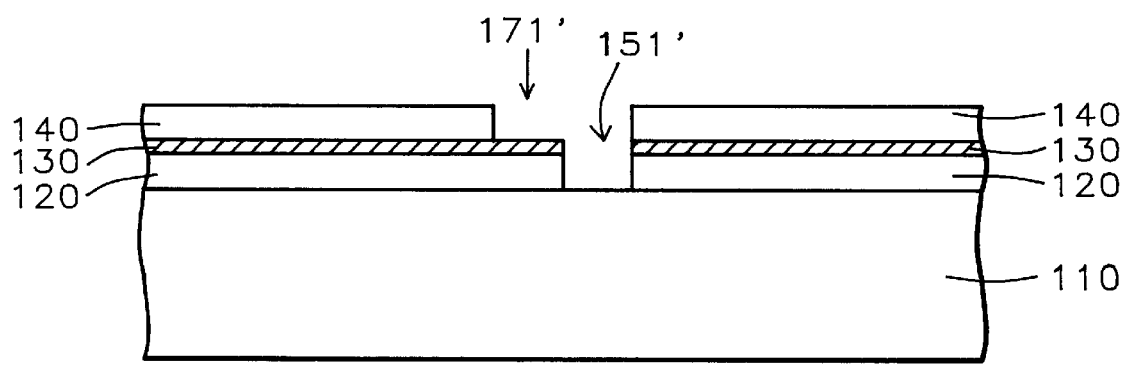
FIG. 3k shows the dual damascene structure formed after photoresist removal, according to this invention.
Figure 3L:
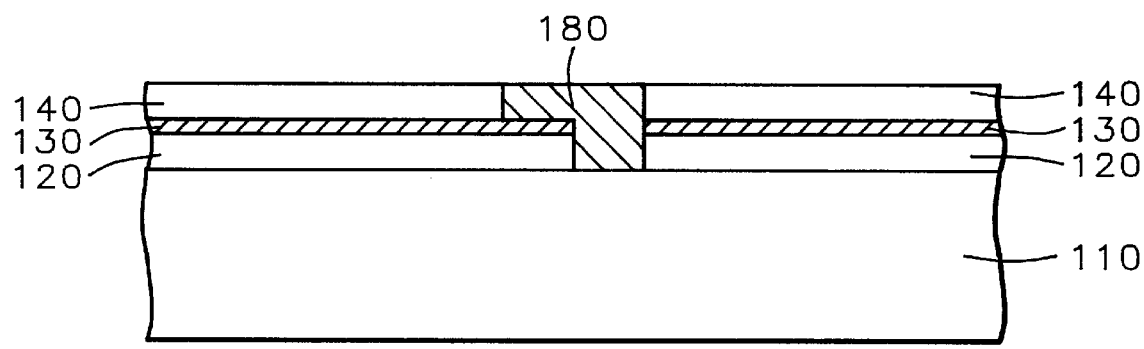
FIG. 3l is a partial cross-sectional view of a semiconductor substrate showing a dual damascene interconnection of to this invention after the depositing of metal into trench and hole of FIG. 3k and chemical mechanical polishing.

FIG. 3k shows the dual damascene structure comprising line trench (171') and vertical hole (151') formed using an ARC inserted in between the two photoresist layers, but employing single photolithography with the aid of an interstitial anti-reflective coating. The dual damascene metal interconnect 180 of FIG. 3l is finally formed after the removal of the layer of photoresist by oxygen ashing and wet stripping with $H_2SO_4$, $H_2O_2$ and $NH_4OH$ solutions and then by depositing metal into the horizontal line trench and vertical hole combination in the composite insulation layer and planarizing the same. It will be understood that the vertical hole may represent a contact hole or a via hole depending upon the nature of the underlying layer, that is, whether the underlying layer is the silicon substrate itself or a wiring layer. It will also be understood by those skilled in the art that various changes in form and details may be made without departing from the spirit and scope of the invention. A case in point are the sequence of using dark and clear field masks which can be altered depending upon a particular application.

While the invention has been particularly shown and described with reference to the preferred embodiments thereof, it will be understood by those skilled in the art that various changes in form and details may be made without departing from the spirit and scope of the invention.

What is claimed is:

1. A method of self-aligned dual damascene patterning by using a developer soluble ARC interstitial layer comprising the steps of:

providing a substrate having a composite layer of insulation deposited thereon whereby said composite layer comprises a first layer of dielectric separated from a second layer of dielectric by an intervening intermediate layer of dielectric;

forming a first layer of photoresist on said composite layer of dielectric insulation;

forming an interstitial layer of anti-reflective coating (ARC) on said layer of photoresist;

forming a second layer of photoresist on said interstitial layer of ARC;

line patterning said second layer of photoresist by exposing said second photoresist through a first mask;

performing a wet development of said second layer of photoresist and interstitial layer of ARC;

hole patterning said first layer of photoresist by exposing said first photoresist through a second mask;

performing a wet development of said first layer of photoresist;

etching said second layer of dielectric underlying said first layer of photoresist using said patterned layer of first photoresist as a mask thereby transferring said hole pattern in said layer of photoresist into said second layer of dielectric;

etching said intermediate layer of dielectric underlying said second layer of dielectric using said first layer of photoresist as a mask thereby transferring said hole pattern in said layer of photoresist into said intermediate layer of dielectric;

blanket etching said second layer of photoresist to extend downward said line pattern until second layer of dielectric is reached;

etching said composite layer of insulation thereby transferring said line pattern in said first layer of photoresist into said second layer of dielectric to form a line trench, and simultaneously transferring said hole pattern in said intermediate layer of dielectric into said first layer of dielectric to form a hole;

removing said layers of photoresist; and depositing metal into said line trench and said hole to form a dual damascene structure.

2. The method of claim 1, wherein said composite layer of insulation is planarized by means of chemical-mechanical polishing (CMP).

3. The method of claim 1, wherein said first layer of dielectric of said composite layer is phosphosilicate glass (PSG) having a thickness between about 0.3 to 0.7 micrometers ($\mu$m).

4. The method of claim 1, wherein said intermediate layer of dielectric is silicon nitride (SiN) having a thickness between about 500 to 2000 angstroms (Å).

5. The method of claim 1, wherein said second layer of dielectric of said composite layer is phosphosilicate glass (PSG) having a thickness between about 0.3 to 0.7 micrometers ($\mu$m).

6. The method of claim 1, wherein said first layer of photoresist is a positive chemical amplification resist (CAR).

7. The method of claim 1, wherein said first layer of photoresist has a thickness between about 0.40 to 0.90 $\mu$m.

8. The method of claim 1, wherein said interstitial layer of anti-reflective coating (ARC) is water soluble.

9. The method of claim 1, wherein said interstitial layer of anti-reflective coating (ARC) has a refractive index between about 1.4 to 2.0.

10. The method of claim 1, wherein said interstitial layer of ARC has a thickness between about 200 to 700 angstroms (Å).

11. The method of claim 1, wherein said second layer of photoresist is a positive chemical amplification resist (CAR).

12. The method of claim 1, wherein said second layer of photoresist has a thickness between about 0.40 to 0.90 μm.

13. The method of claim 1, wherein said first mask has negative resist line patterns with clear field reticle.

14. The method of claim 1, wherein said wet development of said second layer of photoresist and interstitial layer of ARC is accomplished with a recipe comprising 2.38% TMAH developer stream puddled for about 45 to 70 seconds.

15. The method of claim 1, wherein said second mask has positive resist hole patterns with dark field reticle.

16. The method of claim 1, wherein said wet development of said first layer of photoresist is accomplished with a recipe comprising 2.38% TMAH developer stream puddled for about 45 to 70 seconds.

17. The method of claim 1, wherein said etching said second layer of dielectric underlying said first layer of photoresist using said patterned first layer of photoresist as a mask thereby transferring said hole pattern in said first layer of photoresist into said second layer of dielectric is accomplished with an etch recipe comprising gases Ar, $CHF_3$ and $C_4F_0$ at a flow rate between about 50 to 150 sccm, 10 to 50 sccm, and 0 to 22 sccm, respectively, and used in a high density plasma (HDP) oxide etcher.

18. The method of claim 1, wherein said etching said intermediate layer of dielectric underlying said second layer of dielectric using said first layer of photoresist as a mask thereby transferring said hole pattern in said first layer of photoresist into said intermediate layer of dielectric is accomplished by an etch recipe comprising gases Ar, $CHF_3$ and $CF_4$ at a flow rate between about 50 to 150, 0 to 100 and 0 to 50 sccm, respectively, and used in a HDP SiN etcher.

19. The method of claim 1, wherein said etching of said second layer of photoresist to extend downward said line pattern until said second layer of dielectric is reached is accomplished with a recipe comprising gases $O_2$, He and $CF_4$ at a flow rate between about 10 to 250 sccm, 40 to 80 sccm, and 0 to 50 sccm, respectively, and used in a HDP resist etcher.

20. The method of claim 1, wherein etching said composite layer of insulation thereby transferring said line pattern in said layer of photoresist into said second layer of dielectric to form a line trench, and simultaneously transferring said hole pattern in said intermediate layer of dielectric into said first layer of dielectric to form a contact hole is accomplished with an etch recipe comprising gases Ar, $CHF_3$ and $C_4F_0$ at a flow rate between about 50 to 150 sccm, 10 to 50 sccm, and 0 to 22 sccm, respectively, and used in a high density plasma (HDP) oxide etcher.

21. The method of claim 1, wherein said removing said layer of photoresist is accomplished by $O_2$ plasma ashing and then wet stripping by using $H_2SO_4$, $H_2O_2$ and $NH_4OH$ solutions.

22. The method of claim 1, wherein said metal deposited to form a dual damascene structure is copper or aluminum-copper alloy.

23. A method of self-aligned dual damascene patterning by using a developer soluble ARC interstitial layer comprising the steps of:

providing a substrate having a composite layer of insulation deposited thereon whereby said composite layer comprises a top layer of dielectric separated from a bottom layer of dielectric by an intervening intermediate layer of dielectric;

forming a first layer of photoresist on said composite layer;

forming an interstitial layer of anti-reflective coating;

forming a second layer of photoresist on said first layer of photoresist;

line patterning said second layer of photoresist using a first mask;

hole patterning said first layer of photoresist using a second mask;

transferring said hole pattern in said first layer of photoresist into said top and intermediate layers of said composite layer of insulation by etching;

transferring said line pattern in said second layer of photoresist into said second layer of dielectric to form a line trench, and simultaneously transferring said hole pattern in said intermediate layer of dielectric into said first layer of dielectric to form an interconnect hole;

removing said layers of photoresist; and depositing metal into said trench and said hole to form a dual damascene structure and planarizing said composite layer.

24. The method of claim 23, wherein said composite layer is phosphosilicate glass (PSG).

25. The method of claim 23, wherein said intermediate layer of said composite layer of insulation is silicon nitride with a thickness between about 500 to 2000 angstroms (Å).

26. The method of claim 23, wherein said layer of photoresist is a chemical amplification resist (CAR).

27. The method of claim 23, wherein said interstitial layer of anti-reflective coating is water soluble.

28. The method of claim 23, wherein said first mask has negative type resist line patterns with clear field.

29. The method of claim 23, wherein said second mask has positive resist hole patterns with dark field.

30. The method of claim 23, wherein said transferring said line pattern in said layer of photoresist into said second layer of dielectric to form a line trench, and simultaneously transferring said hole pattern in said intermediate layer of dielectric into said first layer of dielectric to form a interconnect hole is accomplished with an etch recipe comprising gases Ar, $CHF_3$ and $C_4F_8$ at a flow rate between about 50 to 150 sccm, 10 to 50 sccm, and 0 to 20 sccm, respectively, used in a HDP oxide etcher.

31. The method of claim 23, wherein said metal deposited to form a dual damascene structure is copper or aluminum-copper alloy.

* * * * *